United States Patent [19]
Chang

[11] Patent Number: 5,963,409
[45] Date of Patent: *Oct. 5, 1999

[54] INPUT/OUTPUT ELECTROSTATIC DISCHARGE PROTECTION CIRCUIT FOR AN INTEGRATED CIRCUIT (IC)

[75] Inventor: Ming-Chien Chang, Hsinchu, Taiwan

[73] Assignee: Vanguard International Semiconductor Corporation, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/770,568

[22] Filed: Dec. 19, 1996

[30] Foreign Application Priority Data

Oct. 14, 1996 [TW] Taiwan ................... 85112508

[51] Int. Cl.$^6$ ............................................. H02H 3/22
[52] U.S. Cl. ............................. 361/56; 361/111; 257/355
[58] Field of Search ................ 361/56, 91, 111; 257/336, 355

[56] References Cited

U.S. PATENT DOCUMENTS

| | | |
|---|---|---|
| 4,609,931 | 9/1986 | Koike ................................... 357/23.13 |
| 4,616,243 | 10/1986 | Minato et al. ....................... 357/23.13 |
| 4,692,834 | 9/1987 | Iwahashi et al. ........................ 361/91 |
| 4,745,450 | 5/1988 | Hartranft et al. .................... 357/23.13 |
| 5,124,578 | 6/1992 | Worley et al. ............................ 361/56 |
| 5,272,586 | 12/1993 | Yen ...................................... 361/111 |
| 5,287,241 | 2/1994 | Puar ......................................... 361/56 |
| 5,440,162 | 8/1995 | Worley et al. .......................... 257/355 |
| 5,479,039 | 12/1995 | Lien .......................................... 361/91 |
| 5,498,892 | 3/1996 | Walker et al. .......................... 257/336 |
| 5,663,678 | 9/1997 | Chang .................................... 327/566 |

*Primary Examiner*—Michael J. Sherry
*Attorney, Agent, or Firm*—Fish & Richardson P.C.

[57] ABSTRACT

An input/output electrostatic discharge (ESD) protection circuit for an integrated circuit disposed between an input/output port and the internal circuitry, including an input path protection device and an output path protection device. The output path protection device includes a pair of pull-up and pull-down transistors, two resistors, and a first and a second MOS field effect transistors respectively connected in parallel with the pull-up and the pull-down transistors. The resistors are formed in lightly-doped regions of the source or drain of the pull-up and pull down transistors, respectively, so the series resistance can be reduced efficiently, the driving ability can be prevented from decreasing and the devices can obtain uniform breakdown under intensive layout circumstances. The first and the second MOS field effect transistors are utilized to protect against both positive electrostatic stress and negative electrostatic stress to improve overall ESD protection.

8 Claims, 4 Drawing Sheets

INPUT/OUTPUT ELECTROSTATIC DISCHARGE PROTECTION CIRCUIT FOR AN INTEGRATED CIRCUIT (IC)

BACKGROUND OF THE INVENTION

1. Field of the invention

The invention relates to an electrostatic discharge (hereafter referred to as "ESD") protection circuit for an integrated circuit (IC) and, in particular, to an input/output ESD protection circuit of a Metal-Oxide-Semiconductor (MOS) IC which can protect the internal circuitry of the MOS IC from electrostatic discharge damage.

2. Description of the Related Art

A MOS device in a MOS IC includes a drain, a gate, and a source, all formed within a body. The body of the MOS device may be a substrate or a well region of the substrate where the MOS device is formed. The drain and source are spaced a lateral distance from each other and are formed by two doped regions in the substrate or in the well region of the substrate by using a diffusion or ion implantation method. The gate is located on the substrate between the drain and source to control the on/off states of the channel between the drain and source. Generally, the gate consists of a gate oxide layer and a conduction layer formed by a silicon oxide layer and a polysilicon layer, respectively. The MOS device is used as a "controlled source" and a "controlled switch" and the control signal is inputted to the gate.

The gate oxide layer in the MOS device is formed by an extremely thin silicon oxide layer, approximately several hundred Å in thickness. The dielectric breakdown strength of the silicon oxide is about $12 \times 10^6$ V/cm, so the maximum breakdown voltage of the gate oxide layer (silicon oxide layer) is several tens of volts. For example, the gate oxide layer of 150 Å in thickness can bear a maximum breakdown voltage of about 18 V. In the normal operation of the MOS device, the input voltage is always less than the maximum breakdown voltage mentioned above. However, a voltage in excess of the maximum breakdown voltage may appear on input pins of the MOS IC due to ESD. There are many sources of electrostatic stress, such as human body contact as well as those occuring during the measurement, installation, and operation of MOS ICs. Electrostatic stress may damage or shorten the life of MOS ICs.

Therefore, an ESD protection circuit is typically disposed between an input/output port of the MOS IC and an internal circuit to protect internal MOS devices from damage. A conventional ESD protection method provides a conduction path to a power source line or a ground (i.e., a high voltage source $V_{DD}$ and a low voltage source $V_{SS}$ in the MOS IC) between the input/output port and the internal circuit, so the ESD will directly pass through the conduction path to protect internal MOS devices from damage when electrostatic stress is applied to the IC.

An input/output buffer driver device for the MOS IC is generally used as an input/output ESD protection circuit. Only when the electrostatic stress enters the MOS IC from the input/output port, does the buffer driver device provide a bipolar discharge path to accomplish the ESD protection function. So far, there are two input/output ESD protection circuits. One is an NMOS input/output ESD protection circuit; the other is a CMOS input/output ESD protection circuit. Basically, the NMOS input/output ESD protection circuit is similar to the CMOS input/output ESD protection circuit, so, only the CMOS input/output ESD protection circuit will be explained here.

Referring to FIG. 1, a schematic view shows the conventional CMOS input/output ESD protection circuit. An input/output port 2 is a bonding pad through which the signal received by the right-hand circuit of FIG. 1 can be outputted and through which the outside signal can also be inputted to the left-hand circuit of FIG. 1. However, unlike normal signals, when electrostatic stress is applied to the input/output port, the electrostatic stress will pass through the right-hand and left-hand circuits simultaneously. As shown in FIG. 1, the left-hand circuit consists of a PMOS 6 and an NMOS 8 which are connected to each other in series and coupled between a high-voltage source $V_{DD}$ and a low-voltage source $V_{SS}$. The left-hand circuit serves as the input buffer of the IC. A diffusion resistor 4 is constructed by an N-type diffusion region formed in the P-type semiconductor substrate in order to protect the internal circuitry of the CMOS IC. The N⁻-type diffusion region and P-type semiconductor substrate can form a PN junction diode. When electrostatic stress applied to the input/output port is higher than the breakdown voltage of the PN junction diode, an ESD path will be formed to protect the internal circuit from damage. Similarly, the diffusion resistor 4 can also be constructed by a P-type diffusion region formed in an N-type well region. Generally, the N-type well region is used to form a PMOS device and is connected to the high-voltage source $V_{DD}$. In summary, the diffusion resistor 4 formed by an N-type diffusion region can limit negative-going transition electrostatic stress while the diffusion resistor 4 formed by a P-type diffusion region can limit positive-going transition electrostatic stress. The right-hand circuit consists of a PMOS 12 and an NMOS 14 connected to each other in series and coupled between the high-voltage source VDD and low-power source $V_{SS}$. This right-hand circuit serves as the output buffer of a CMOS IC wherein the PMOS 12 is called a pull-up transistor and the NMOS 14 is called a pull-down transistor. This circuit differs from the left-hand circuit in that the drains of the PMOS 12 and NMOS 14 are connected to the input/output port, and not the gates. So the ESD path can be created by the sources, drains and bodies of the PMOS 12 and NMOS 14.

Moreover, with continuous device miniaturization, the ESD problem gets increasingly worse. First, the ESD effect is related to device size. The smaller the device size, the lower the sustainable ESD stress. That is, the ESD protection circuit must have stronger ESD immunity before real protection can be attained. Second, the lightly-doped drain (LDD) commonly used in a submicron process is not suitable for use in an ESD protection circuit because the device having a LDD structure may create local hotspots resulting in advance device damage as electrostatic stress is applied.

Currently, there are many methods for improving the ESD protection of MOS ICs in a submicron process. The first method is to connect a resistor in series to each of the pull-up and pull-down transistors to create a uniform breakdown effect on the ESD path. However, a device having a larger width is needed. The second method is to connect a MOS device in parallel to the pull-down transistor to increase the effectiveness of the ESD path from the input/output port to the low-voltage source $V_{SS}$ (a ground). However, although the method can provide efficient protection for positive electrostatic stress, the method is not effective for protecting against negative electrostatic stress.

SUMMARY OF THE INVENTION

Based on the above, the purpose of the invention is to provide an input/output ESD protection circuit for an IC having improved ESD protection ability at an input/output port.

Another purpose of the invention is to provide an input/output ESD protection circuit for the IC at the input/output port which can create a uniform breakdown effect under the ESD stress applied.

Another purpose of the invention is to provide an input/output ESD protection circuit for the IC which not only protects the internal circuitry of the IC from positive electrostatic stress damage, but also efficiently protects the internal circuitry of the IC from negative electrostatic stress damage.

According to the purposes mentioned above, the invention provides an input/output ESD protection circuit for an IC which is disposed between the input/output port and the internal circuitry of the IC. The input/output ESD protection circuit includes an input path protection device and an output path protection device. The input path protection device is disposed on the input path from the input/output port to the internal circuitry while the output path protection device is disposed on the output path from the internal circuitry to the input/output port, thereby preventing damage to the internal circuitry of the IC caused from electrostatic stress applied to the input/output port. In the input/output ESD protection circuit, the output path protection device includes two resistors, a pull up transistor, a pull-down transistor, and two MOS transistors. One end of the first resistor is connected to the input/output port. The source and drain of the pull-up transistor are connected to a high voltage source $V_{DD}$ and to the other end of the first resistor, respectively. One end of the second resistor is connected to the input/output port. The source and drain of the pull-down transistor are connected to the low voltage source $V_{SS}$ and the other end of the second resistor, respectively. The gates of the pull-up transistor and pull-down transistor are connected to the internal circuitry of the MOS IC. The source and drain of the first MOS transistor are connected to the input/output port and the low-voltage source $V_{SS}$, respectively, while the source and drain of the second MOS transistor are connected to the input/output port and the high-voltage source $V_{DD}$, respectively. The gates of a first MOS transistor and a second MOS transistor are connected to the low-voltage source $V_{SS}$. The MOS transistors function better with non-lightly-doped structures. The first resistor is formed as part of a lightly-doped region in the source or drain of the pull-up transistor and is disposed in a well region with the dopant of the lightly-doped region being the same as that of the well region. Similarly, the second resistor is formed as part of the lightly-doped region in the source or drain of the pull-down transistor and is disposed in the well region with the dopant of the lightly-doped region being the same as that of the well region.

The input path protection device includes a resistor in the diffusion region of the substrate and a third MOS transistor. The diffusion resistor is connected between the input/output port and the internal circuit and the source and drain of the third MOS transistor are coupled between one end of the diffusion resistor which is connected to the internal circuit and the low voltage source Vss. The gate of the third MOS transistor gate is connected to the low voltage source $V_{SS}$.

BRIEF DESCRIPTION OF THE DRAWINGS

The purposes, characteristics, and advantages of the invention will be explained clearly in the following description of a preferred embodiment and the accompanying drawings.

DETAIL DESCRIPTION OF THE INVENTION

Figure 1:
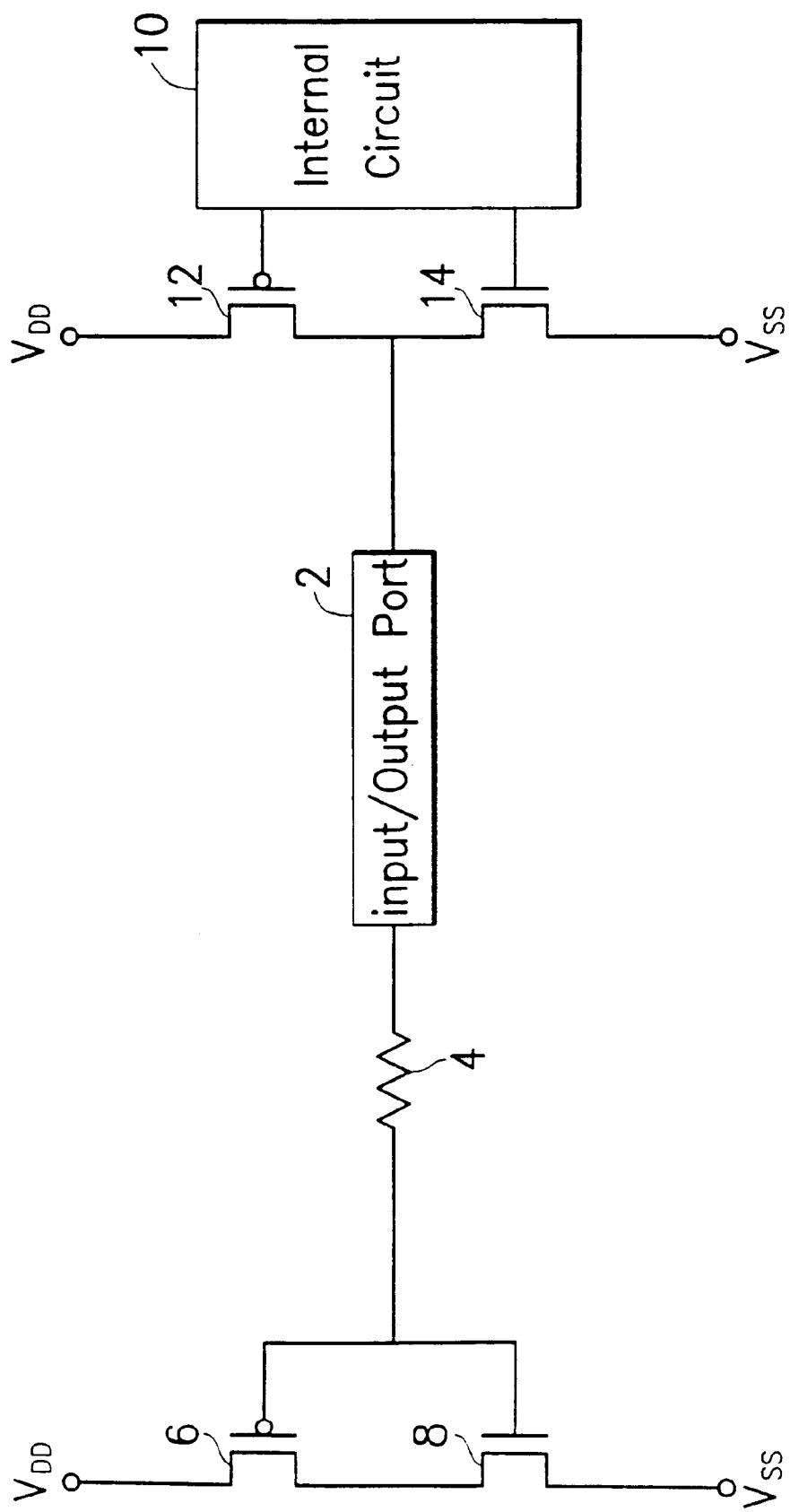
FIG. 1 is a schematic view showing a conventional ESD protection circuit for integrated circuits.
Figure 2:
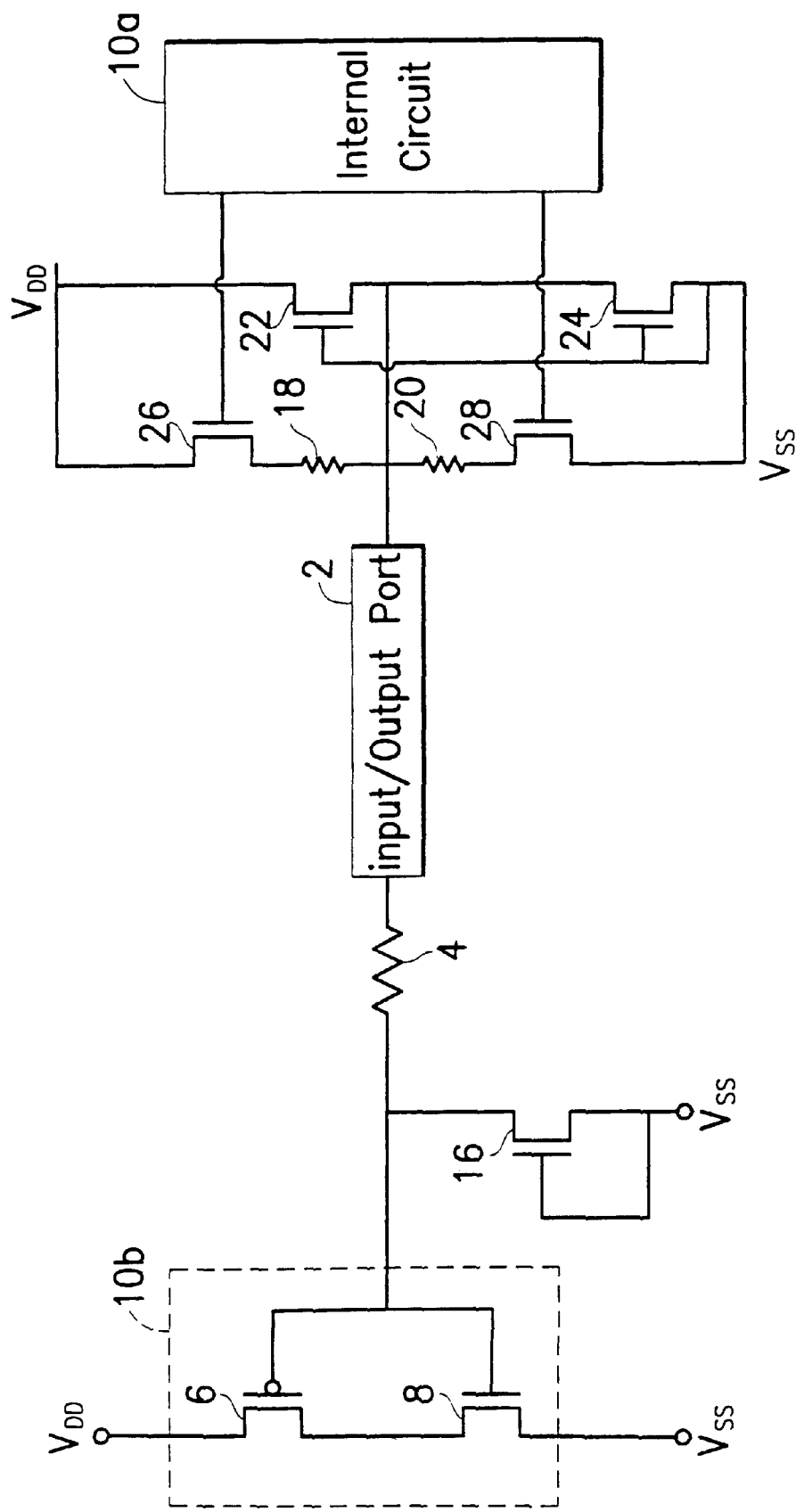
FIG. 2 is a schematic view showing an input/output ESD protection circuit of the invention.

Referring to FIG. 2, devices which are the same as those in FIG. 1 are labelled with the same reference numerals. Note that the internal circuit 10 includes an internal circuit section 10a and internal circuit section 10b. An input/output ESD protection circuit includes an input path protection device and an output path protection device. The input path protection device (i.e., the circuit on the left-hand side of the input/output port 2 excepting the PMOS 6 and NMOS 8) is located between the input/output port 2 and the input path of the internal circuit section 10a. The output path protection device is located between the internal circuit section 10b and the output path of the input/output port 2, i.e. the circuit on the right-hand side of the input/output port 2. The purpose of the input/output ESD protection circuit is to protect the internal circuit 10 from electrostatic discharge damage applied to the input/output port 2 through the input path and output path.

The input path protection circuit (the left-hand circuit), will be discussed first. The input path protection device includes a diffusion resistor 4 and an NMOS transistor 16. The diffusion resistor 4 is connected between the input/output port 2 and an input buffer which includes a PMOS 6 and an NMOS 8, of the internal circuit section 10a. As discussed earlier, the diffusion resistor 4 is formed by a doped diffusion region (for example, N-type dopant) in the semiconductor substrate (for example, P-type substrate), resulting in the formation of a PN junction. When ESD stress appears, the on-state resulting from the breakdown of the PN junction will occur to protect the input buffer. The NMOS transistor 16 functions better with a non-lightly-doped drain structure which provides a reduced resistance to attain the preferred ESD protection effect. The drain and source of the NMOS transistor 16 are connected between one end of the diffusion resistor 4 and the low voltage source $V_{SS}$, respectively, and the gate of the NMOS transistor 16 is connected to the low voltage source $V_{SS}$. The NMOS transistor 16 provides ESD protection by means of the lower gate breakdown voltage induced by a parasitic bipolar action created in the drain-source regions of the NMOS transistor. That is, the parasitic bipolar action created in the drain-source regions under reverse bias serves as the ESD path. The parameters of the diffusion resistor 4 and the NMOS transistor 16 are determined according to practical applications to turn on both the PMOS 6 and the NMOS 8 before electrostatic stress is large enough to cause gate damage.

As for the right-hand circuit, an output path protection device includes two resistors 18 and 20, a pull-up transistor 26, a pull-down transistor 28, and two FET transistors 22 and 24. In the preferred embodiment, although the pull-up transistor 26 and the pull-down transistor 28 are formed by two NMOS devices, the operation principle is the same as that of the CMOS devices in FIG. 1, so only a discussion of using two NMOS devices is provided here. The resistor 18 is connected between the pull-up transistor 26 and the input/output port 2 while the resistor 20 is connected between the input/output port 2 and the pull-down transistor 28. The resistors 18 and 20 are both formed as parts of lightly-doped regions forming the sources or drains of the pull-up transistor 26 and the pull-down transistor 28, respectively. The resistors 18, 20 are disposed in a well region with the lightly-doped region and the well region having the same type dopant. The resistors 18 and 20 are formed as parts of $N^-$-type lightly-doped regions in the drains of the NMOS transistors and disposed in an N-type well region. The series resistors being formed as lightly-doped regions efficiently lowers the series resistance and prevents the driving ability of the input/output device from decreasing under the intensive input/output device layout considerations. When electrostatic stress is applied, current density limited by the electron saturation velocity can be improved, thus attaining uniform device breakdown. The FET transistors 22 and 24, connected to the pull-up transistor 26 and pull-down transistor 28 in parallel, are MOS transistors with non-lightly-doped drain structures and are mainly used to enhance ESD protection. The source and drain of the FET transistor 22 are connected to the input/output port 2 and the high voltage source $V_{DD}$, respectively, and the gate of the FET transistor 22 is connected to the low-voltage source $V_{SS}$. The source and drain of the FET transistor 24 are connected to the input/output port 2 and the low voltage Vss, respectively, and the gate of the FET transistor 24 is connected to the low-voltage source $V_{SS}$. In the preferred embodiment, the FET transistor 22 provides protection for negative electrostatic stress while the FET transistor 24 protects against positive electrostatic stress. Since there are no lightly-doped drain structures in these conventional submicron devices, the FET transistors 22 and 24 can obtain uniform breakdown, thus lowering the resistance and improving ESD protection.

In FIG. 2, the resistor 20 is connected in series to the pull-down transistor 28 which is connected to the FET transistor 24 and together provide protection for positive electrostatic stress. Resistor 28 is connected in series to the pull-up transistor 26 which is connected to the FET transistor 22 and together provide protection for negative electrostatic stress.

Figure 3:
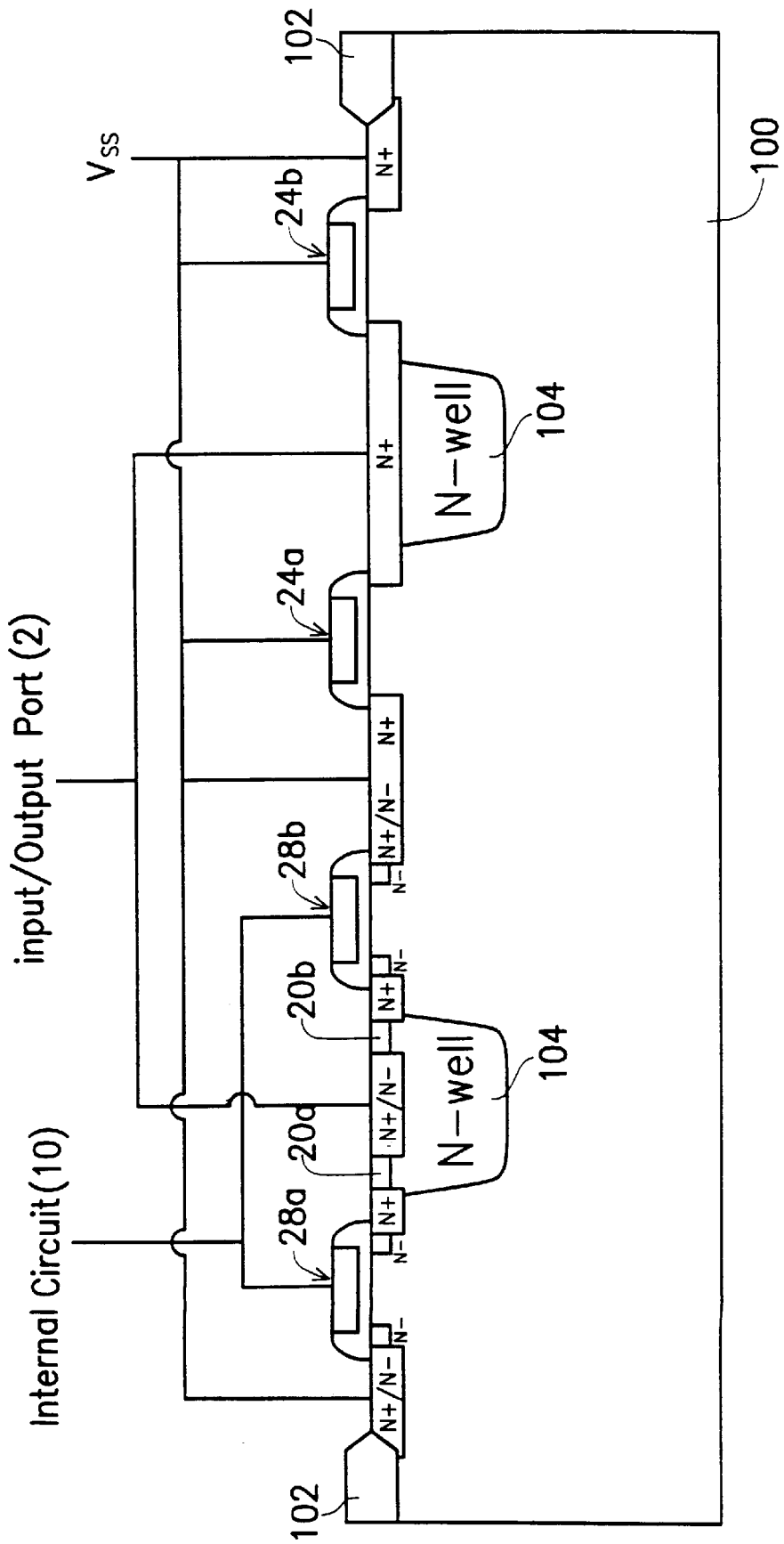
FIG. 3 is a cross-sectional view of part of the input/output ESD protection circuit structure between the input/output port and the low voltage source ($V_{SS}$) of the invention.
Figure 4:
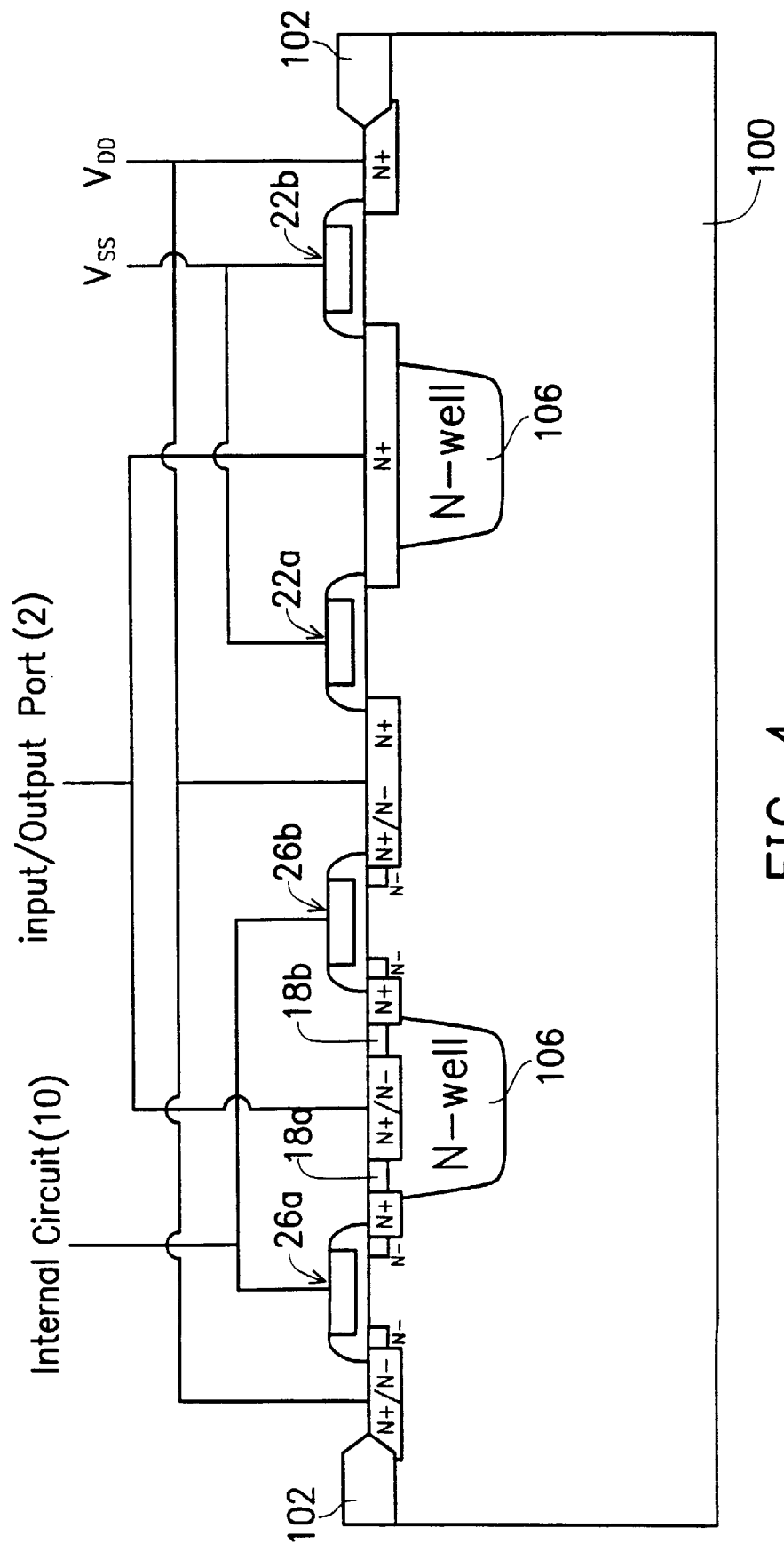
FIG. 4 is a cross-sectional view of part of the input/output ESD protection circuit structure between the input/output port and the high voltage source ($V_{DD}$) of the invention.

Referring to FIGS. 3 and 4, two cross-sectional views, each of which includes two sets of parallel devices mentioned above, show parts of the input/output ESD protection circuit structure between the input/output port 2 and the low voltage source $V_{SS}$ and between the input/output port 2 and the high voltage source $V_{DD}$, respectively. The same devices as those in FIG. 2. are marked with the same reference numerals with letters "a" and "b" used to distinguish each one of the parallel devices. In FIG. 3, the semiconductor substrate 100 is doped with a p-type dopant in which field oxides 102 are formed to define the device active region. The pull-down transistors (28a and 28b) are NMOS transistors with lightly doped diffusion (LDD) structures, and have their gates connected to the internal circuit 10. The FET transistors (24a and 24b) are NMOS transistors without LDD structures, one having a source and the other of the transistors having a drain connected to the input/output port 2. The resistors (20a and 20b) are formed in an N-type well region 104. The $N^-$ resistors (20a and 20b) can be formed simultaneously with N– lightly-doped regions in the sources and drains of the pull down transistors (28a and 28b) and do not require any extra mask processes.

In FIG. 4, the pull-up transistors (26a and 26b) are NMOS transistors with LDD structures, and have their gates connected to the internal circuit 10. The FET transistors (22a and 22b) are NMOS transistors without LDD structures, one of the transistors having a source and the other of the transistors having a drain connected to the input/output port 2. The resistors (18a and 18b) are formed in the N-type well region 106. Similarly, The $N^-$ resistors (20a and 20b) can be formed simultaneously with $N^-$ lightly-doped regions in the sources and drains of the pull-up transistors and do not require any extra mask processes.

In summary, the input/output ESD protection circuit for an integrated circuit (IC) in the invention has the following advantages:

1. The resistors connected in series to the pull up transistor and the pull-down transistor are formed by parts of lightly-doped regions in the sources or drains of the pull-up transistor and the pull-down transistor. This efficiently lowers the series resistance, prevents a decrease in driving ability of input/output devices, and attains a uniform device breakdown during intensive layout circumstances. Moreover, no extra mask processes are needed when creating the series resistors, thus reducing fabrication cost.

2. The FET transistors between the input/output port and the low-voltage source $V_{SS}$ and high-voltage source $V_{DD}$ protect against positive electrostatic stress and negative electrostatic stress, respectively, to improve the ESD protection.

Although the invention is disclosed by the preferred embodiment, it is not intended to limit the invention. Those knowledgeable in the art can make modifications within the scope and spirit of the invention which is determined by the claims below.

What is claimed is:

1. An input/output electrostatic discharge protection circuit for an integrated circuit (IC) disposed between an input/output port and an internal circuit to protect said internal circuit from electrostatic discharge damage through said input/output port comprising:

an output path protection device which comprises:
a pull-up transistor having one source/drain connected to a high-voltage node of said IC;
a first resistor connected between said input/output port and another source/drain of said pull-up transistor;
a pull-down transistor having one source/drain connected to a low-voltage node of said IC; and
a second resistor connected between said input/output port and another source/drain of said pull-down transistor,
wherein at least one of said first and second resistors is constituted by a first lightly-doped region formed in a first well region, said first lightly-doped region and said first well region being of the same type dopant so as to concurrently discharge a current therethrough during an ESD event.

2. The input/output electrostatic discharge protection circuit for an integrated circuit (IC) as claimed in claim 1 further including a first MOSFET transistor with a non-lightly-doped drain structure connected in parallel with said pull-up transistor.

3. The input/output electrostatic discharge protection circuit for an integrated circuit (IC) as claimed in claim 1 further including a second MOSFET transistor with a non-lightly-doped drain structure connected in parallel with said pull-down transistor.

4. The input/output electrostatic discharge protection circuit for an integrated circuit (IC) as claimed in claim 1 wherein said low-voltage node of the IC is a ground.

5. The input/output electrostatic discharge protection circuit for an integrated circuit (IC) as claimed in claim 1 further comprising an input path protection device which comprises:

a diffusion resistor connected between said input/output port and said internal circuit; and a third FET transistor having a drain coupled to one end of said diffusion resistor, a source connected to said low-voltage source of the IC and a gate connected to said low voltage source.

6. The input/output electrostatic discharge protection circuit for an integrated circuit (IC) as claimed in claim 5 wherein said third FET transistor is a MOS transistor with a non-lightly-doped drain structure.

7. The input/output electrostatic discharge protection circuit for an integrated circuit (IC) as claimed in claim 1 wherein the other one of said first and second resistors is constituted by a second lightly-doped region formed in a second well region, said second lightly-doped region and said second well region being of the same type dopant.

8. The input/output electrostatic discharge protection circuit for an integrated circuit (IC) as claimed in claim 7 wherein said first lightly doped region and said second lightly doped region are of the same type dopant.

* * * * *